United States Patent
Agarrwal

(10) Patent No.: US 6,200,453 B1
(45) Date of Patent: Mar. 13, 2001

(54) MONOLITH ELECTROPLATING PROCESS

(76) Inventor: Rajev R. Agarrwal, 1410 S. Busse Rd., 2K, Mt. Prospect, IL (US) 60056

( * ) Notice: Subject to any disclaimer, the term of this patent is extended or adjusted under 35 U.S.C. 154(b) by 0 days.

(21) Appl. No.: 09/405,610

(22) Filed: Sep. 24, 1999

Related U.S. Application Data

(63) Continuation-in-part of application No. 08/954,774, filed on Oct. 20, 1997, now abandoned.

(51) Int. Cl.$^7$ .................................................... C25D 3/66
(52) U.S. Cl. ............................................ 205/230; 205/82
(58) Field of Search .................................. 205/230–238, 205/81, 82–84, 231, 232, 233; 204/243.1, 247.5

(56) References Cited

U.S. PATENT DOCUMENTS

| | | | |
|---|---|---|---|
| 3,859,176 | * 1/1975 | Shang | 205/76 |
| 3,983,012 | * 9/1976 | Cohen | 205/99 |
| 5,215,631 | * 6/1993 | Westfall | 205/351 |

OTHER PUBLICATIONS

R. R. Agarwal, "Electrodeposition of Cadmium Films from a Chloroaluminate Melt", Presented at Symposium on "Deposition from Nonaqueous Electrolytes", Electrodeposition Division, Electrochemical Society Meeting, Hollywood, Florida, Oct. 1989.

R. R. Agarwal, "Highly Oriented Versus Mircocrystalline Thick Cadium Films Deposited on Polycrystalline Nickel from a Molten Salts Electrolyte", Presented at Symposium on Surface Processing in Energy Technology, ECS Meeting, St. Louis, Missouri, May 1992.

R. R. Agarwal, "Film Formation of Cadmium on Nickel from Molten $AlCl_3$–NaCl–$BaCl_2$ Eutectic", Presented at Symposium on "Advances in High Temperature Interfacial Chemistry", Electrochemical Society Meeting (ECS), Toronto, Canada, Oct. 1992.

R. R. Agarwal, "Fundamental Results on Electrodeposition in Molten Salts", Presented at Symposium on "Electrochemically Deposited Thin Films", Electrochemical Society Meeting, Miami Beach, Florida, Oct. 1994.

* cited by examiner

*Primary Examiner*—Kathryn Gorgos
*Assistant Examiner*—Wesley A. Nicolas

(57) ABSTRACT

An electroplating process for preparing a monolith metal layer over a polycrystalline base metal and the plated monolith product. A monolith layer has a variable thickness of one crystal. The process is typically carried in molten salts electrolytes, such as the halide salts under an inert atmosphere at an elevated temperature, and over deposition time periods and film thickness sufficient to sinter and recrystallize completely the nucleating metal particles into one single crystal or crystals having very large grains. In the process, a close-packed film of submicron particle (20) is formed on a suitable substrate at an elevated temperature. The temperature has the significance of annealing particles as they are formed, and substrates on which the particles can populate are desirable. As the packed bed thickens, the submicron particles develop necks (21) and as they merge into each other shrinkage (22) occurs. Then as micropores also close (23) by surface tension, metal density is reached and the film consists of unstable metal grain (24) that at high enough temperature recrystallize (25) and recrystallized grains grow into an annealed single crystal over the electroplating time span. While cadmium was used in the experimental work, other soft metals may be used.

6 Claims, 10 Drawing Sheets

US 6,200,453 B1

MONOLITH ELECTROPLATING PROCESS

This application is a continuation-in-part of application Ser. No. 08/954,774 filed on Oct. 20, 1997, now abandoned.

"This invention was made with Government support under Contract No. W-31-109-ENG-38 awarded by the Department of Energy. The Government has certain rights in the invention".

BACKGROUND

1. Field of Invention

This invention relates to an electroplating process for depositing a single crystal metal layer on to a polycrystalline base metal from molten salts electrolyte and to the plated product.

2. Description of Prior Art

The present day electroplating processes deposit either polycrystalline or microcrystalline metal films on polycrystalline base metals.

In these processes, metal atoms produced by the electrochemical reactions during electroplating aggregate into metal clusters on the surface of a base metal, the clusters grow by incorporation of metal atoms into metal crystals, and metal crystals grow by incorporation into metal films.

The processes have two limitations. First, the aggregation or nucleation is rarely sufficient to fully cover the surface of a base metal; and second, the metal crystals that are produced have a tendency to accumulate dislocations or defects. This results in the formation of polycrystalline or microcrystalline metal films. Both these types of films are significantly imperfect.

A polycrystalline film has significant number of grain boundaries, and a microcrystalline film has substantial porosity. This makes them both permeable, and corrosion of base metals proceeds through these pores. Current electroplating processes are unable to avoid grain boundaries and micropores during deposition on polycrystalline base metals and require subsequent annealing.

OBJECTS AND ADVANTAGES

Accordingly, several objects and advantages of my invention are (a) to provide an electroplating process which can be used to produce a single crystal metal film of desired thickness over a polycrystalline base metal;

(b) to provide an electroplating process which can be used to control the grain size in a metal film;

(c) to provide an electroplating process which can be used to produce an annealed metal film;

(d) to provide an electroplating process which can be used to produce a nonporous metal film;

(e) to provide an electroplating process which can be used to obtain full coverage of the base metal with submicron sized metal particles;

(f) to provide an electroplating process in which sintering and recrystallization occur in-situ and produces a single crystal metal layer;

Further objects and advantages are that the process may be used to prepare alloys by doping a metal layer or by concurrent deposition. Still other objects and advantages of my invention will become apparent from a consideration of the drawings and ensuing description.

DRAWING FIGURES

In the drawings, closely related figures have the same number but different alphabetic suffixes FIGS. 1A to 1C show the existing mechanisms by which only polycrystalline or microcrystalline metal layers electroplate on to polycrystalline base metals, the prior art.

REFERENCE NUMERALS IN DRAWINGS

Figures 1A, 1B, 1C:
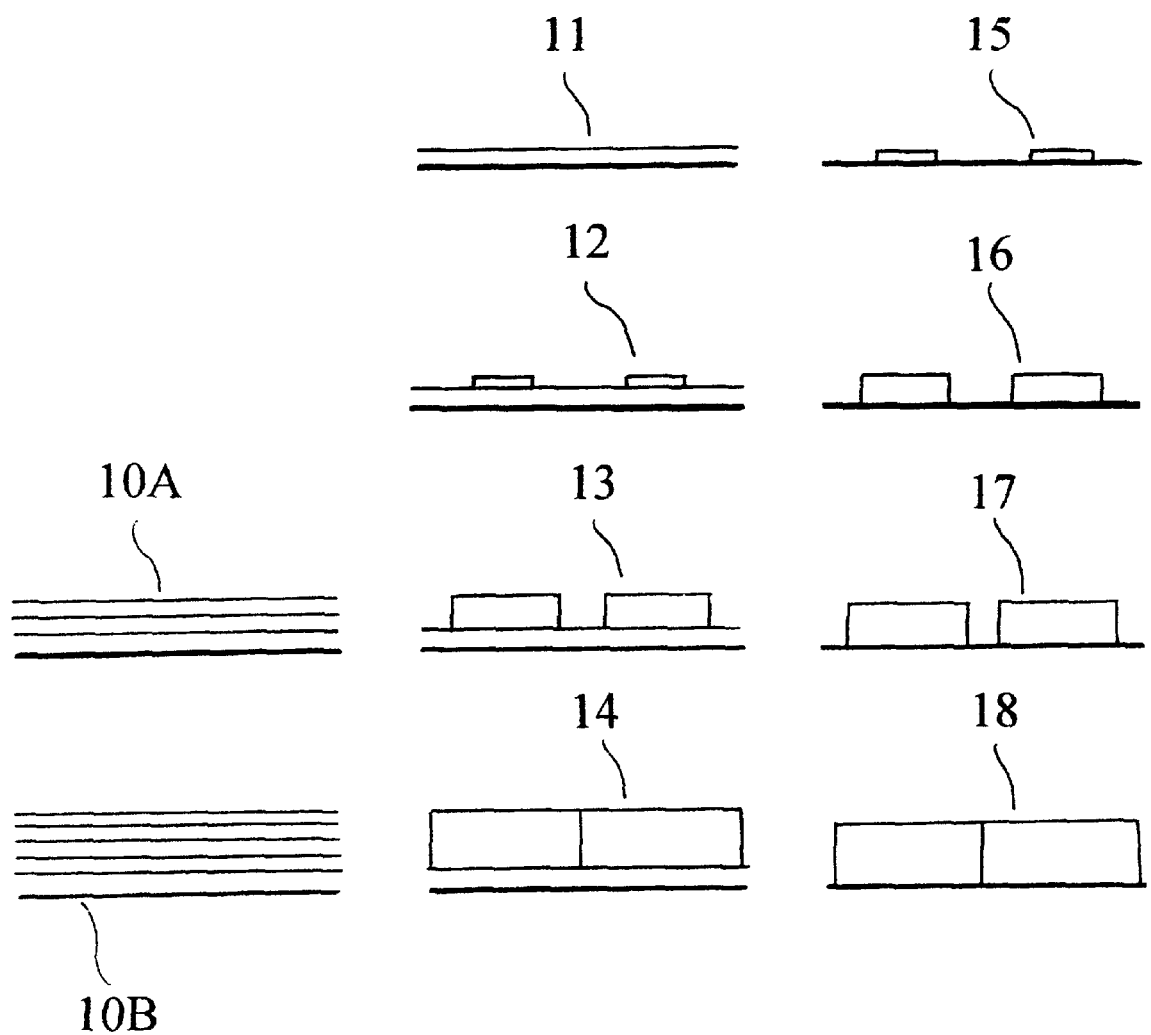

10A layer-by-layer growth of a polycrystalline metal film on a polycrystalline base metal
10B a polycrystalline metal film produced on a polycrystalline base metal
11 underpotential deposition of monolayers of a metal on a base metal
12 nucleation of metal clusters on the monolayers
13 formation of metal crystals on the monolayers
14 a polycrystalline metal film produced on the monolayers on a base metal
15 nucleation of metal clusters on a base metal
16 formation of metal crystals on a base metal
17 overlap of growth centers on a base metal
18 a polycrystalline metal film produced on a base metal
20 nucleation of a packed bed of metal particles on a base metal
21 nucleation and coalescence amongst the particles to form larger particles
22 nucleation and sintering to form micropores in the packed bed
23 nucleation and shrinkage of micropores in the packed bed
24 a thin film with unstable solid-solid metal interfaces on a base metal
25 a single crystal metal layer after complete recrystallization on a base metal
30 current-potential curve in an unpurified chloroaluminate molten salts electrolyte
31 current-potential curve in the partial purified chloroaluminate salts electrolyte
32 current-potential curve in the purified chloroaluminate salts electrolyte
40 current-potential curve in melt with 2.1 weight percent of cadmium chloride at 172.3° C.
41 current-potential curve in melt with 4.25 weight percent of cadmium chloride at 169.3° C.
42 current-potential curve in melt with 4.25 weight percent of cadmium chloride at 119.5° C.
43 current-potential curve in melt with about 1 weight percent of cadmium iodide at 139.5° C.
50 current density for forming annealed 0.15 micrometers cadmium particles at 115–170° C.

51 current density for forming annealed 0.45 micrometers cadmium particles at 115–170° C.
52 current density for sintering two 0.15 micrometers cadmium particles at 115–170° C.
53 current density for sintering two 0.15 micrometers cadmium particles at 115–170° C.

SUMMARY

This process relates to an electroplating method for depositing a monolith metal layer on to a polycrystalline or single crystal base metal. A monolith layer is understood to have a variable thickness of one crystal. The process is typically carried out in a molten salts electrolyte at an elevated temperature under an inert atmosphere. A close-packed bed of submicron particles (a novelty by itself) is formed on a suitable base metal by nucleation of metal. The electroplating temperature is such that particles increase by coalescence. As the film thickens, volumetric sintering occurs by formation of necks between metal particles. This causes shrinkage and produces submicron pores in the packed bed. Then as submicron pores also close by surface tension, metal density is reached and the film consists of unstable solid interfaces that at high enough temperature recrystallize and grains grow into an annealed monolith layer.

An experimental proof of the concept is provided based on the electroplating of cadmium from a chloroaluminate molten salts electrolyte under a purified helium atmosphere. The molten salts electrolyte is first purified by electrolysis to remove oxides and metal impurities. A suitable salt of the metal is then added to the purified electrolyte. After a stable concentration of metal ions is reached, electroplating conditions are adjusted so as to prepare a single crystal metal layer. This involves the selections of suitable base metals, deposition rates, and temperature for complete annealing, sintering, recrystallization during electroplating. It is shown that an annealed single crystal metal layer can be prepared on a polycrystalline base metal it specific conditions.

Description—FIGS. 1 to 7

A paper by J. A. Venables titled "Capabilities and Limits on Nucleation Theories" in Thin Solid Films, Vol. 32, 1976, pp. 135–141 discusses three ways by which solids films can be prepared on the surface of another solid in a deposition process. These mechanisms are shown in FIG. 1. The present day electroplating technology is based on these mechanisms.

The underlying mechanism by which a solid film is produced in a deposition process depends on the solid-solid interactions of the metal and base metal and on supersaturation or concentration of metal atoms on the base metal. The polycrystalline or microcrystalline types of metal films are produced on polycrystalline base metals by these mechanisms.

Schematics 10A and 10B show the layer-by-layer or Frank van der Merwe mechanism. This mechanism occurs when a depositing material is more strongly bound to a base material than to itself. If the crystal structures of the two materials are similar then an epitaxial growth can occur on the substrate or base material. In an epitaxial deposition, a single crystal can only be formed when the deposition is carried out on a single crystal base metal. The schematics 11–14 show a case where layer deposition first occurs and is followed by nucleation of metal clusters. This is called the Stranski mechanism. In Stranki mechanism, the interfacial properties of the solid-solid surface change with thickness of the initial layer and ultimately film formation occurs by growth of nucleation centers. The schematics 15–18 show the Volmer-Weber mechanism, which occurs when the deposit is more strongly bound to itself than to a base material. In this case, the film formation also occurs by the growth of the nucleation centers. In summary, these mechanisms depend on the tendency of materials to grow into larger crystals to form a solid film.

Figure 2:
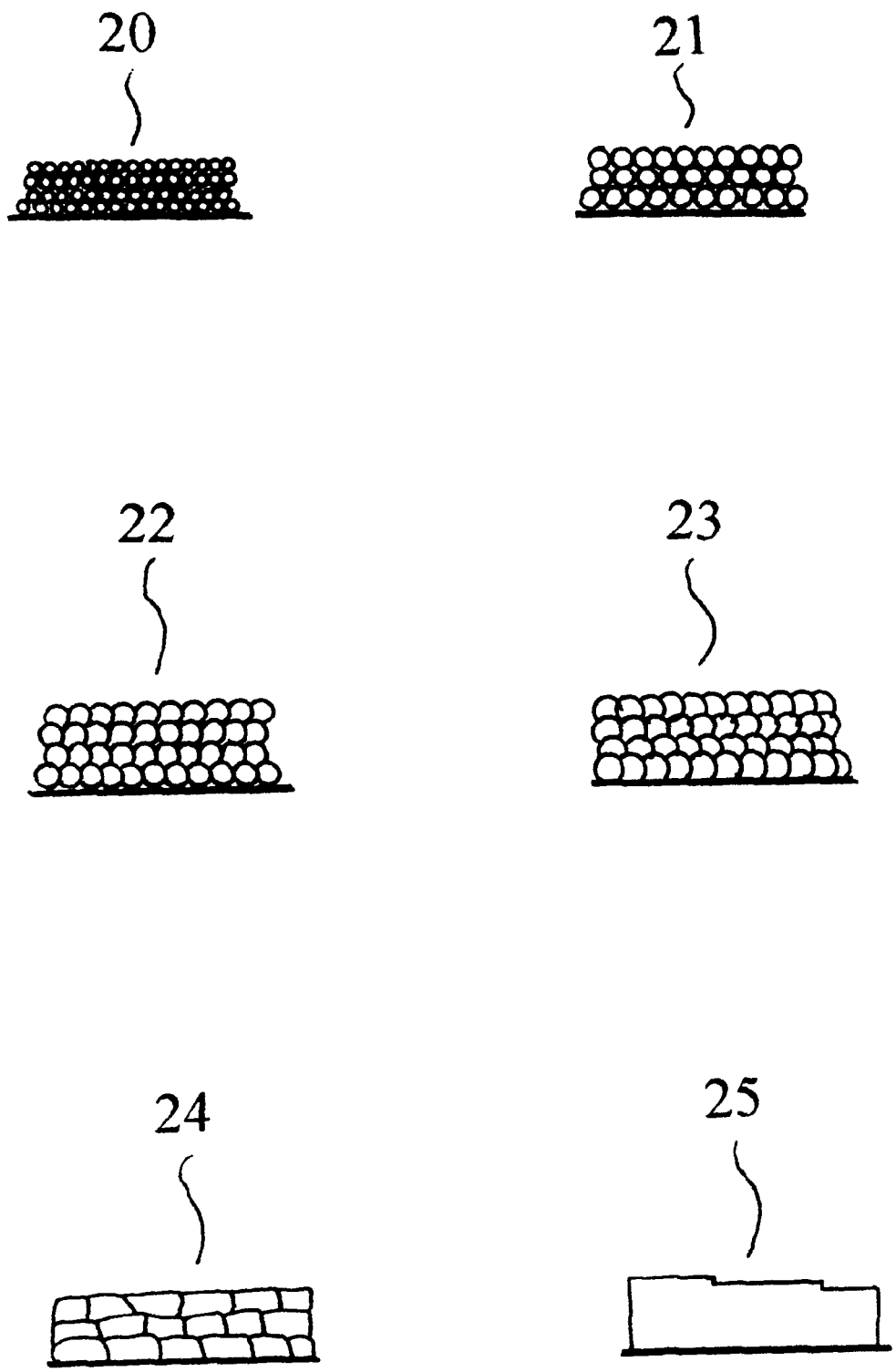
FIG. 2 shows the concept of invention by which single crystal metal layers electroplate on to polycrystalline base metals from molten salts electrolytes.

FIG. 2 shows the concept of the invention. The process is typically carried out at temperatures above the room temperature under an inert atmosphere. The basic step again is nucleation of a metal on a base metal. But unlike present day electroplating processes, nucleation and annealing are used to produce a packed bed of submicron particles on suitable base metal as shown in schematic 20. A packed bed can produce a film by the growth of the particles. However, this is not a desirable step in the process. Instead, the process uses coalescence of particles to increase the particle sizes. Schematic 21, shows that coalescence will produce larger particles. As the bed thickens, sintering occurs amongst the larger particles. Schematic 22 shows the sintering will produce necks and micropores by coalescence of adjacent necks. The schematic 23 shows that micropores also have a tendency to shrink due to surface tension forces. As more and more micropores are formed they drive the shrinkage in the bed and as they disappear metal density is reached. The schematic 24 shows that the metal film after micropores disappear consists of unstable solid-solid interfaces. Schematic 25 shows these unstable grains can be recrystallized into an annealed monolith or single crystal metal layer on a polycrystalline base metal.

The process consists of selections of a molten salts electrolyte and metal ion solute that can be used to electroplate individual crystals of the metal on several base metals. Then a selection of a suitable base metal is made. The base metal should be capable of producing adherent deposits and populated with metal particles. The selection of temperature and current density are then carried out so that annealing, sintering, and recrystallization can go to completion during the electroplating of metal on the polycrystalline or single crystal base metal from molten salts.

The molten salts electrolyte should be formed such that it consists of at least one halide salt of the metal and at least one other halide salt from a group comprising of alkali metals and alkali earth metals. The composition of the electrolyte should be such that its melting point is below the 0.70 fraction of the melting point of the metal measured on the absolute temperature scale. This calculation gives the lowest process temperature. For example for cadmium, the lowest process temperature is 123° C. The metal halide salt should be readily soluble in the electrolyte. For example, a metal chloride is more soluble in chloride melts.

Since the process is not based on the concept of epitaxial growth, it can be used with either single crystal or polycrystalline base metals. The base metals can be selected from a range of transition metals that have melting points greater than the melting point of the metal. In addition, the base metals should not form an alloy or intermetallic compound below the 0.75 fractional temperature of the melting point of the metal on absolute temperature scale. Further, the base metal should not form stable oxide films in the molten salts electrolyte. An intermediate metal layer of a suitable base metal can be used on an unsuitable base material. For example, a nickel or copper intermediate layer may be used on 320 stainless steel for cadmium electroplating.

For selecting a suitable base metal, the electrolyte temperature is raised to 0.70 fraction of the melting point of the metal on the absolute temperature scale. Then electroplating is carried out to deposit a 5–10 micrometer thick film of the metal at a current density of 1–14 mA/cm². The electroplated base metal is washed with distilled water to dissolve salts and dried under vacuum at 10–20° C. for about 1–3 hours. The washed and dried electroplated base metal is then viewed under a microscope to determine whether the deposits are sparse or a bulk film. Then deposits are scratch-tested using a needle to determine whether they flake or adhere to the base metal. The electroplating is repeated using different base metals until an adherent bulk metal film is obtained. At the above temperature and current density, annealed deposits are formed.

Preparing a single crystal consists of two other steps: first, determining the temperature at which surface tension forces in submicron sized particles are substantial and second, electroplating at a temperature at which sintering, recrystallization, and grain growth can go to completion.

Determination the base temperature consists of electroplating 1–4 micrometer film of the metal on a suitable base metal at a current density of 1–14 mA/cm² and temperature of about 0.70 fraction of the melting point of the metal on the absolute temperature scale. The electroplated film is washed with distilled water to dissolve salts, and dried under vacuum at 10–20° C. for 1–3 hours. The washed and dried electroplated film is viewed under a microscope at 7,500–10,000 times magnification to determine if the individual metal particles have flat faces and angles or are smooth metal particles. If the individual metal particles have flat faces and angles the electrolyte temperature is raised by 0.035 fraction of melting point of the metal on an absolute temperature scale. Then electroplating is repeated until smooth metal particles are obtained.

Next, the electrolyte temperature is raised further by 0.05 fraction of the melting point of metal on the absolute temperature scale. Then electroplating is carried out at a current density of 2–28 mA/cm² until sintering, recrystallization, and grain growth give a single crystal metal layer.

The above conditions can be used to electroplate single crystal metal films on to single crystal or polycrystalline base metals. The process is applicable to soft metals such as cadmium, zinc, lead, silver, aluminum, copper and others or to hard metals such as nickel. Hard metals anneal, sinter, recrystallize, and grow at lower rates than soft metals. Therefore higher temperature ratios are needed for hard metals. Current densities are related in this process to above rates in metals.

Figure 3:
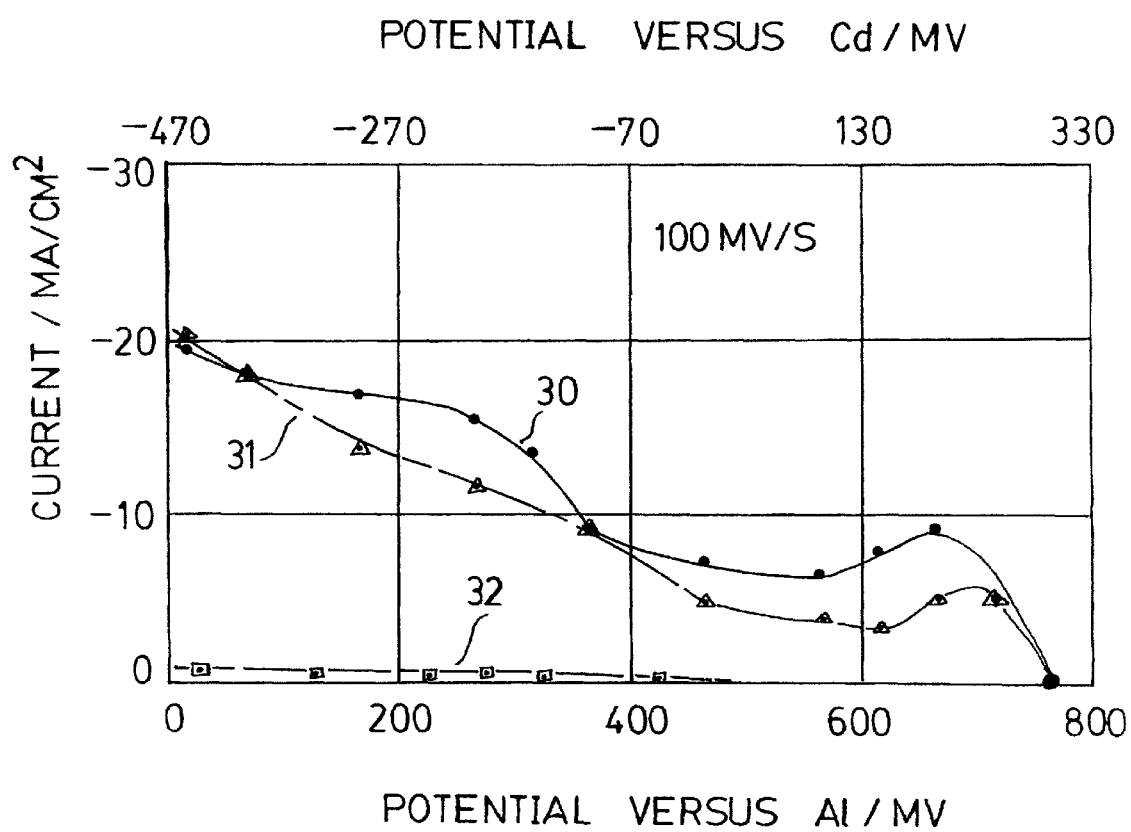
FIG. 3 shows the current-potential curves obtained in a chloroaluminate melt used as a molten salts electrolyte to experimentally prove the concept of invention.

FIG. 3 shows the current-potential curves in the chloroaluminate salts electrolyte in absence of cadmium ions. The electroplating of cadmium from this chloroaluminate molten salts electrolyte is used to prove the concept of invention. It has been shown by R. G. Verdieck and L. F. Yntema in a paper titled "The Electrochemistry of Baths of Fused Aluminum Halides I" in the Journal of Physical Chemistry, Vol. 46, 1942, pp. 353–358 that cadmium can be electrodeposited from a molten salts electrolyte. There are many possible molten salts electrolytes. For example, chloroaluminate eutectics are listed in a handbook by G. J. Janz et. al. titled "Physical Properties Data Compilations Relevant to Energy Storage I. Molten Salt: Eutectic Data", Report NSRDS-NBS 61, Part 1, 1978. R. R. Agarwal et. al. have shown in a paper titled "Electrodeposition of Cadmium from a Low Melting Molten Salt" presented in General Session, Electrodeposition Division, Electrochemical Society Symposium, October 1986, San Diego, that cadmium can be electroplated from a chloroaluminate salts on nickel or 4340 stainless steel, and purification of the electrolyte is desirable. R. J. Gale and R. A. Osteryoung have shown in a paper titled "Investigation of Subvalent Ion Effects during Aluminum Anodization in Molten NaCl-AlCl₃ Solvents" published in Journal of Electrochemical Society, Vol. 121, 1974, pp. 983–987, that impurities present in the chloroaluminate electrolytes can be removed by electrolysis between aluminum electrodes. The work must be carried out under an inert gas atmosphere.

The steps used to arrive at a chloroaluminate molten salts electrolyte consisted of selection of a melting point range for the electrolytes, molten salts electrolytes in the literature that satisfy the temperature criteria, identification of specific molten salts systems, and experiments.

The upper temperature for the melting point range was fixed as the temperature at which glassy metals transform into metal crystals. This temperature is typically 0.67 fraction of the melting point of metal on the absolute temperature scale. For cadmium, this hypothetical temperature is 123° C. The lower temperature for the melting point was fixed as the room temperature. Hence, the desired melting point range of the electrolyte was 25° C. to 123° C.

Molten salts can range from the simple ionic salts such as alkali halides; and less simple oxy-anions such as alkali sulfates, nitrates and carbonates; to complex associated liquids such as phosphates, borates, and silicates. Various factors such as thermal, chemical and electrochemical stability, and deposition of cadmium from them were considered. The aluminum halides were selected as they satisfied the temperature and potential criteria for cadmium.

Next, several haloaluminate and cadmium halide mixtures were considered. It was observed that ternary melts had lower melting points and cadmium halides would allow the use of high current densities. After comparing melting points, composition-temperature gradients at their eutectic melting points, solubility of cadmium salts, volatility, and electrochemical potential windows; two haloaluminate mixtures were selected. The selected mixtures had compositions (in mole percent) 78 AlBr₃-22 KCl (Eut., 75° C.) and 63.5 AlCl₃-34 NaCl-2.5 BaCl₂ (Eut., 50° C.).

The mixed haloaluminate above was rejected because it was very volatile and consists of mixed halides that produce a complex electrolyte. Thus chloroaluminate electrolyte was selected.

The selected chloroaluminate eutectic had a composition of (in mole percent) 63.5 AlCl₃-34 NaCl-2.5 BaCl₂ and a eutectic melting point of 50° C. To this composition (in weight percent of total weight) about 9 percent excess aluminum chloride was added to account for evaporation. The resulting freezing point of the melt typically ranged from 83° C. to 68° C.

The electrolyte was prepared from anhydrous, ultra pure, and sublimed salts by heating a mixture of stoichiometric quantities of the salts at 170° C. in enclosed pyrolytic graphite coated graphite crucible or a PYREX test tube, in a helium atmosphere glove box. After melting, the electrolyte was purified by electrolysis at 150–171° C. between aluminum electrodes until a colorless or pale yellow melt was obtained.

The main impurities in a chloroaluminate melt are oxides from reaction of the salts with moisture and ferric chloride from aluminum chloride. During electrolysis, metal ions such as ferric ions are removed at the cathode (negative electrode) and oxide ions at the anode (positive electrode). When electrolysis is carried out with aluminum electrodes, aluminum dissolves at the anode and deposits on the cathode. Metal ions lower than aluminum in the electrochemical series, such as ferric ions, thus also get displaced by the aluminum. This speeds up the purification. A paper by R. W. Berg, H. A. Hjuler, and N. J. Bjerrum, titled "Phase Diagram of the NaCl-AlCl$_3$ System near Equimolar Composition, with determination of the Cryoscopic Constant, the Enthalphy of Melting, and Oxide Contaminations", in Inorganic Chemistry, Vol. 23, 1984, pp. 557–565 discusses oxide impurities in chloroaluminate melts.

The electrolytic purification was carried out at several constant potentials as this gave a better control of the purification. The electrochemical cell consisted of three electrodes and the electrolyte, in the pyrolytic graphite coated graphite crucible or the PYREX test-tube. The potentials were measured with respect to a reference electrode. An aluminum rod served as a reference electrode. The term potential is used in this work for the potential difference between the working and reference electrodes. A working electrode is defined as an electrode of interest. For example, in electroplating of cadmium on nickel, the nickel electrode is a working electrode. The third electrode was a counter electrode, which is used to complete the electric circuit. The measured currents flow between the working and counter electrodes.

Prior to the electrolyte purification, cyclic voltammetry of the electrolyte was carried out at 100 mV/s to obtain a current-potential profile of initial impurities in the melt. Then purification was carried out at potentials sufficient to remove these impurities. Purification was typically carried out over night; and the following day, the purification would be intermittently stopped to carry out cyclic voltammetry. This procedure was continued until the impurities became constant in the voltammetry. It was observed that aluminum electrodes had to be intermittently replaced to avoid short circuit due to formation of dendrites of aluminum in the cell.

The cyclic voltammetry was carried out with a nickel electrode as a working electrode and with aluminum reference and counter electrodes. There are no nickel ions in the melt. However, as shown by B. Tremillon et. al. in a paper titled "Electrochemistry in Molten NaAlCl$_4$ (at 210° C.): Identification of Dissolved Oxide containing Species, Solubility of Alumina in terms of pCl and Properties Related to H$_2$O in this Melt", published in Journal of Electroanalytical Chemistry, Vol. 74, 1976, pp. 53–67, that nickel can react with oxide impurities in chloroaluminate melts. That is, a nickel electrode can be used to monitor the oxide content in chloroaluminate melts.

Curve 30 shows a current-potential profile of the impurities in the impure chloroaluminate electrolyte during cathodic scans at 100 mV/s and 146° C. Although potentials were measured with respect to an aluminum reference electrode, for convenience, they are also shown on a cadmium reference scale (470 mV vs. Al at 150–156° C.). The peak observable at 690 mV (vs. Al) is from the nickel and oxide reaction, and the peak at 266 mV (vs. Al) is from the ferric ions. Purification of the electrolyte was carried out at 100 mV (vs. Al). The curve 31 shows current-potential profile after a passage of 341 coulombs during the purification of 95 grams of the melt at 148° C. Curve 32 shows the current-potential profile after 17120 coulombs at 171° C. As the electrolyte was purified, its color changed from reddish brown to pale yellow or colorless. The concentrations of the impurities in the melt were about 1 mM after purification.

Figure 4:
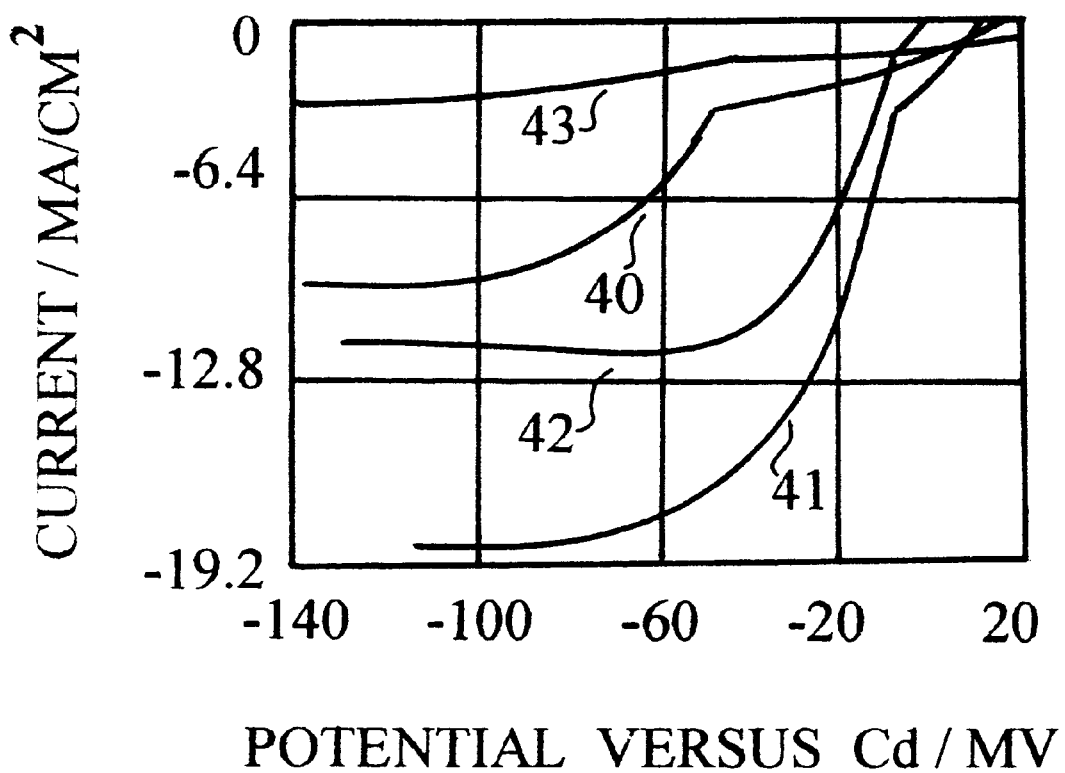
FIG. 4 shows the current-potential curves after the dissolution of cadmium chloride or cadmium iodide in the purified chloroaluminate molten salts electrolyte.

FIG. 4 shows the cathodic current-potential curves after dissolving cadmium chloride or cadmium iodide in the purified chloroaluminate electrolyte. The cadmium halides were selected on the basis of their chemical reactions with aluminum chloride. The cadmium iodide was selected because it has the lowest melting point amongst the cadmium halides, and cadmium chloride because it has a known solubility in the chloroaluminate melts. It was observed that below 115° C. ohmic resistance in the electrolyte was substantial. Therefore, experiments were typically carried out at temperatures between 115–171° C.

The dissolution of cadmium halides in the chloroaluminate melt produced two cathodic plateaus during cyclic voltammetry at scan rates of 1–2 mV/s. These plateaus correspond to a reduction of the two cadmium ions that are formed in the chloroaluminate melts. It was observed that it took 30–40 hours for the cadmium ions to reach an equilibrium concentration in the melt. Also, the cadmium content after equilibrium was 8–10 times greater than expected.

The above results can be explained on the basis of chemistry of cadmium ions in chloroaluminate melts. It has been shown by J. D. Corbett, and R. K. McMullan in a paper titled "The Preparation of Acid-Stabilized Subhalides from Molten Metal-Metal Halide Solutions", in Communications to the Editor, Journal American Chemical Society, Vol. 78, 1956, pp. 2906–2907, that cadmium metal reacts in its molten halides. This produces $Cd_2^{2+}$ ions and equilibrium concentrations of $Cd^{2+}$ and $Cd_2^{2+}$ ions in molten cadmium halides. These authors have showed that aluminum chloride stabilizes the $Cd_2^{2+}$ ions and its salt can be isolated.

In an electrochemical study, D. A. Hames, and J. A. Plambeck titled "Electrochemistry of Zinc, Cadmium, and Mercury Ions in Fused AlCl$_3$-NaCl-KCl Eutectic", published in Canadian Journal of Chemistry, Vol. 46, 1968, pp. 1727–1733, showed the two cadmium ions produce two peaks during voltammetry. R. R. Agarwal has shown in a paper titled "Mechanism of Cadmium Deposition From an Acidic Chloroaluminate Melt", presented at the Seventh International Symposium on Molten Salts, Physical Electrochemistry/High Temperature Materials Division, Electrochemical Society Symposium, Montreal, Canada, May 1990, that three cadmium peaks are produced at high scan rates. Agarwal noted that cadmium peak become more complex as concentration of cadmium chloride is increased. The third cadmium peak was assigned to the chemical disproportional reaction in chloroaluminate melts and other peaks to association of cadmium ions. That is, electrochemistry is complex in this system.

The cadmium halide was typically added after purification of the electrolyte. After purification, the melt was filtered through a fine nickel sieve into another crucible containing a weighed and dried sample of cadmium halide. The nickel sieve and PYREX funnel were preheated to avoid freezing of the melt during filtering. The filtering was necessary to remove residual aluminum particles in the purified melt. After filtering, a nickel working electrode and cadmium reference and counter electrodes were suspended in the electrolyte or closed by means of a special PTFE cover containing the electrodes. The electrolyte was then allowed to freeze and its freezing point measured by recording the cooling curve on a strip-chart recorder.

Before electrolysis, the crucible was lowered into the furnace-well and its temperature set to the desired temperature. Then the cell electrodes were connected to the electrochemical circuit. The electrolyte was typically allowed to reach equilibrium potential over a period of about 3 hours. Then cyclic voltammetry was carried out in the melt at scan rates of 1–200 mV/sec.

Curve 40 shows the current-potential curve at 2 mV/sec after dissolving (in weight percent) 2.1 cadmium chloride in the chloroaluminate electrolyte at 172.3° C. The cadmium chloride content is based on the total cadmium in the electrolyte. The total cadmium was measured by Atomic Absorption Spectrophotometry in aqueous solutions (PPM) of the electrolyte. It can be seen that an extrapolation of the cadmium curve gives the observed rest potential. That is, the rest potentials correspond to equilibrium cadmium ions in the electrolyte. A single discontinuity in the curve shows there are two cadmium ions in the electrolyte. The first part of the curve is due to reduction of $Cd^{2+}$ ions to $Cd_2^{2+}$ ions, and second to reduction of $Cd_2^{2+}$ ions to Cd atoms.

Curve 41 shows the current-potential curve at 2 mV/sec in (in weight percent) 4.25 cadmium chloride in the chloroaluminate electrolyte at 169.3° C. It can be observed from this curve that the proportion of $Cd_2^{2+}$ ions increased with increase in cadmium chloride content.

Curve 42 shows the current-potential curve at 2 mV/sec in (in weight percent) 4.25 cadmium chloride in the electrolyte at 119.5° C. It can be observed from this curve that proportion of $Cd_2^{2+}$ ions increased when the electrolyte temperature was lowered.

Curve 43 shows the current-potential curve at 10 mV/sec scan rate in (in weight percent) 1 cadmium iodide in the electrolyte at 139.5° C. It can be seen that concentration of cadmium ions is low when cadmium iodide is used as a solute in the chloroaluminate melt.

Figure 5A:
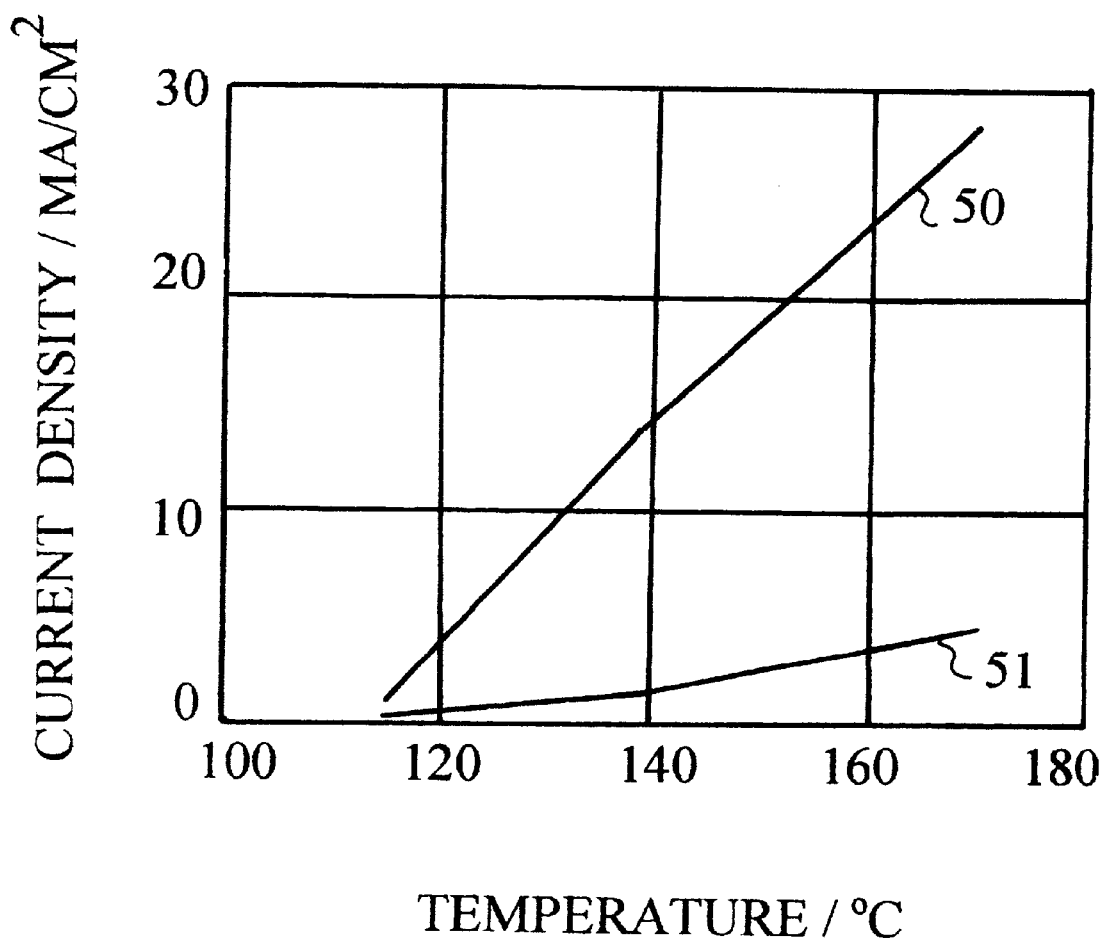
FIGS. 5A and 5B show the desired range of current densities to achieve complete annealing, sintering, and recrystallization of metal particles as per the concept of invention.
Figure 5B:
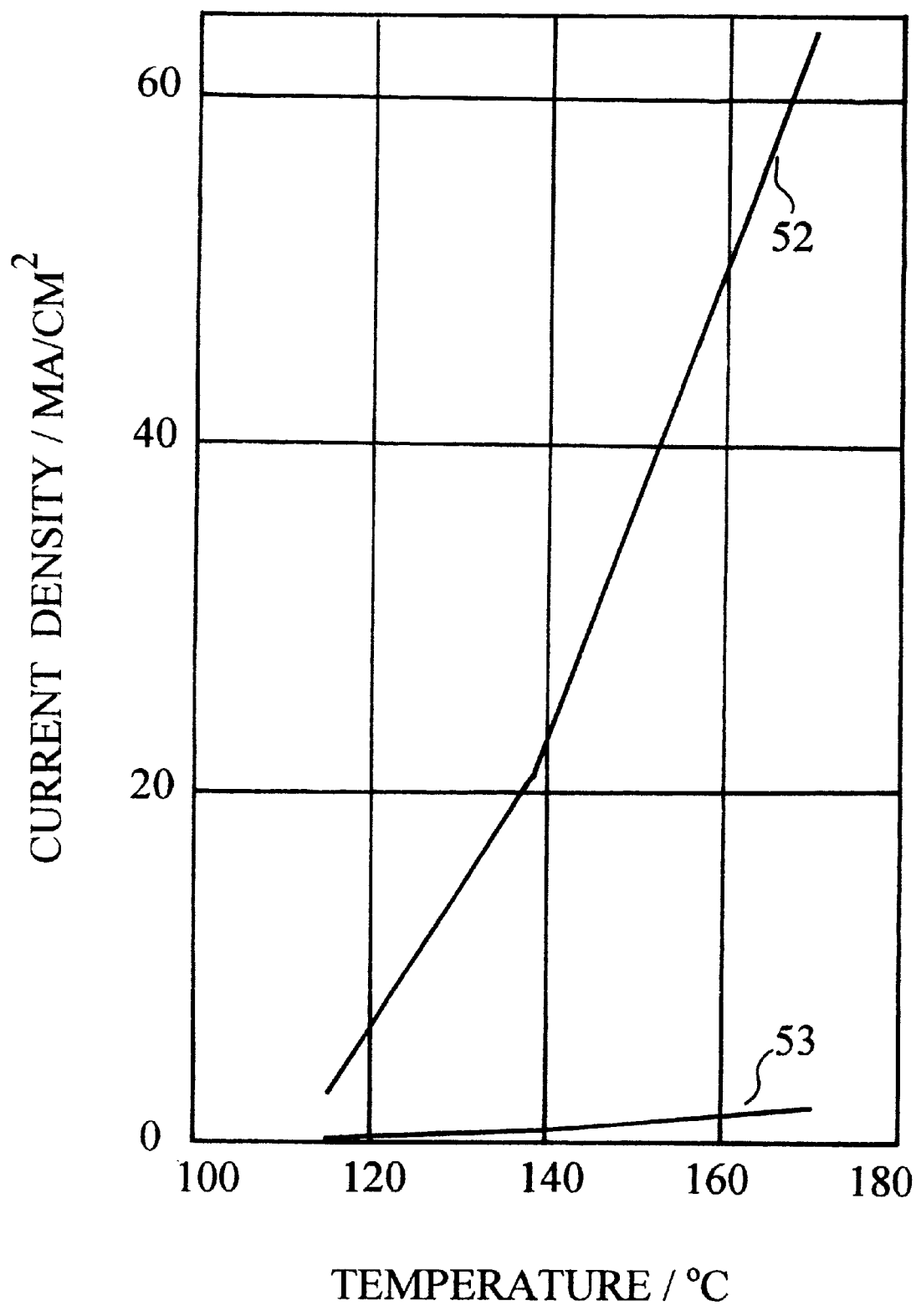

FIGS. 5A and 5B show the range of current densities for complete annealing, sintering and recrystallization of metal particles. Metal particles with dislocations grow by incorporation of metal atoms. As per the concept of the invention, the electroplating must be carried out at such temperature and current density that annealed particles without dislocations are formed.

In annealing, defects in metal crystals are removed by self-diffusion. The self-diffusion coefficient of a metal depends on the temperature and its Arrhenius constants. For single crystal cadmium, the Arrhenius constants are 0.68 $cm^2/sec$ and 20.6 kcal/mole. This gives self-diffusion coefficients of $2*10-12\ cm^2/sec$ at 115° C., $1.64*10-11\ cm^2/sec$ at 149° C., and $5.4*10-11\ cm^2/sec$ at 170° C. These self-diffusion coefficients can be used to calculate time constants for annealing of cadmium particles of different sizes. For example, the time constants for 0.15 micrometers diameter cadmium particles are 28 sec at 115° C., 2 sec at 149° C. and 1 sec at 170° C. Assuming that metal deposition rates must not exceed annealing rates, current densities (for an average charge transfer coefficient of 1.5 for the two cadmium ions in chloroaluminate melts) are about 1 $mA/cm^2$ at 115° C., 14 $mA/cm^2$ at 149° C., and 28 $mA/cm^2$ at 170° C. FIG. 5A shows the current densities based on annealing rates of cadmium particles of diameters 0.15 and 0.45 micrometers between 115–170° C. Curve 50 shows the current densities for 0.15 micrometers particles and curve 51 the current densities for 0.45 micrometers diameter particles. These curves show that current densities to be used should decrease with temperature and as particle sizes increase.

Sintering of particles can occur by viscous flow, volume diffusion, plastic deformation, surface diffusion, or evaporation-condensation mechanisms. Nonporous materials are typically formed by the first three mechanisms. Further, in absence of a deforming force and electroplating below the melting of metal, sintering must be achieved by volumetric diffusion. As per this mechanism, solid particles sinter by volumetric and surface diffusion of lattice vacancies or holes in the neck regions between two particles. In a paper titled "Theory of Solid State Sintering", in Powder Metallurgy edited by W. Leszynski, in Proceedings of an International Conference held in New York, Interscience Publishers, New York, 1960, G. C. Kuczynski developed an equation for coalesce times for two solid particles by the volumetric diffusion. The coalescence time is directly proportional to volume and temperature and inversely proportional to surface tension, density, and vacancy diffusion. Based on this formula, coalescence times were estimated for cadmium particles of diameters of 0.15 and 0.45 micrometers assuming a surface tension of 650 $ergs/cm^2$, and density of 13.2 $cm^3/gmole$. For example, sintering times for two 0.15 micrometers cadmium particles were about 20 seconds at 115° C., 3 seconds at 149° C., and only 1 second at 170° C. The corresponding current densities are about 3 $mA/cm^2$ at 115° C., 21 $mA/cm^2$ at 149° C., and 64 $mA/cm^2$ at 170° C. FIG. 5B show current densities based on sintering rates of cadmium particles of diameter of 0.15 and 0.45 micrometers at 115–170° C. Curve 52 shows the current densities for 0.15 micrometers particles and curve 53 for 0.45 micrometers particles. Again, current densities to be used must decrease with temperature and as particle sizes increase.

The metal films that are produced after annealing and sintering will have many grain boundaries. Grain boundaries are removed in this process by in-situ recrystallization. In an unpublished scientific report titled "Monolith Electroplating Phenomena", Submitted for Review to California Institute of Technology, University of Illinois at Urbana Champaign, and Argonne National Laboratory, May 1995, R. R. Agarwal showed that recrystallization is highly favored when a metal film consists of close-packed submicron sized metal particles. The extensive solid-solid grain boundaries not only drive rapid annealing and sintering but also recrystallization. Further, the temperature should be such that grains produced during recrystallization also disappear.

Based on FIGS. 5A and 5B, current densities of 1–14 $mA/cm^2$ and temperature of about 149° C. are suitable for electroplating annealed particles of cadmium. Since recrystallization requires dense submicron sized particles, higher current densities are desirable. Also, a range of particle sizes will always be formed during electroplating. Thus for combined annealing, sintering and recrystallization the current density range is 2–28 $mA/cm^2$ at 170° C. for cadmium electroplating. As shown here the current densities and temperature depend on the metal's melting point, self-diffusion coefficient and surface tension. On the absolute temperature scale, a temperature of 149° C. corresponds to a dimensionless ratio of 0.71 and 170° C. to dimensionless ratio of 0.75 measured with respect to melting point of cadmium. For soft metals with similar self-diffusion coefficients and surface tension, similar condition can be used to prepare single crystals.

Figure 6A:
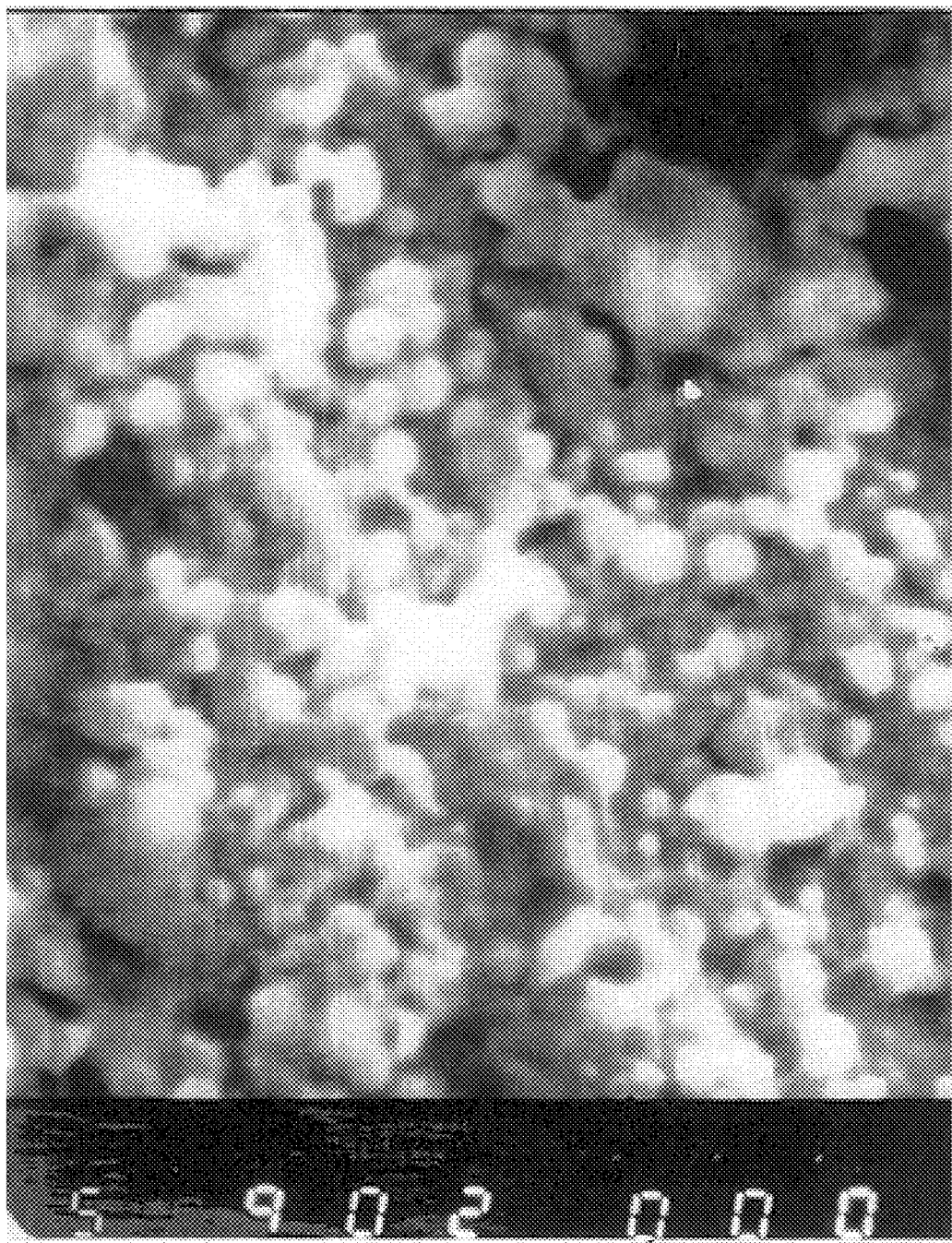
FIGS. 6A and 6B show the microscopic difference between completely annealed smooth metal particles and metal particles with flat faces and angles used to establish sintering temperature.
Figure 6B:
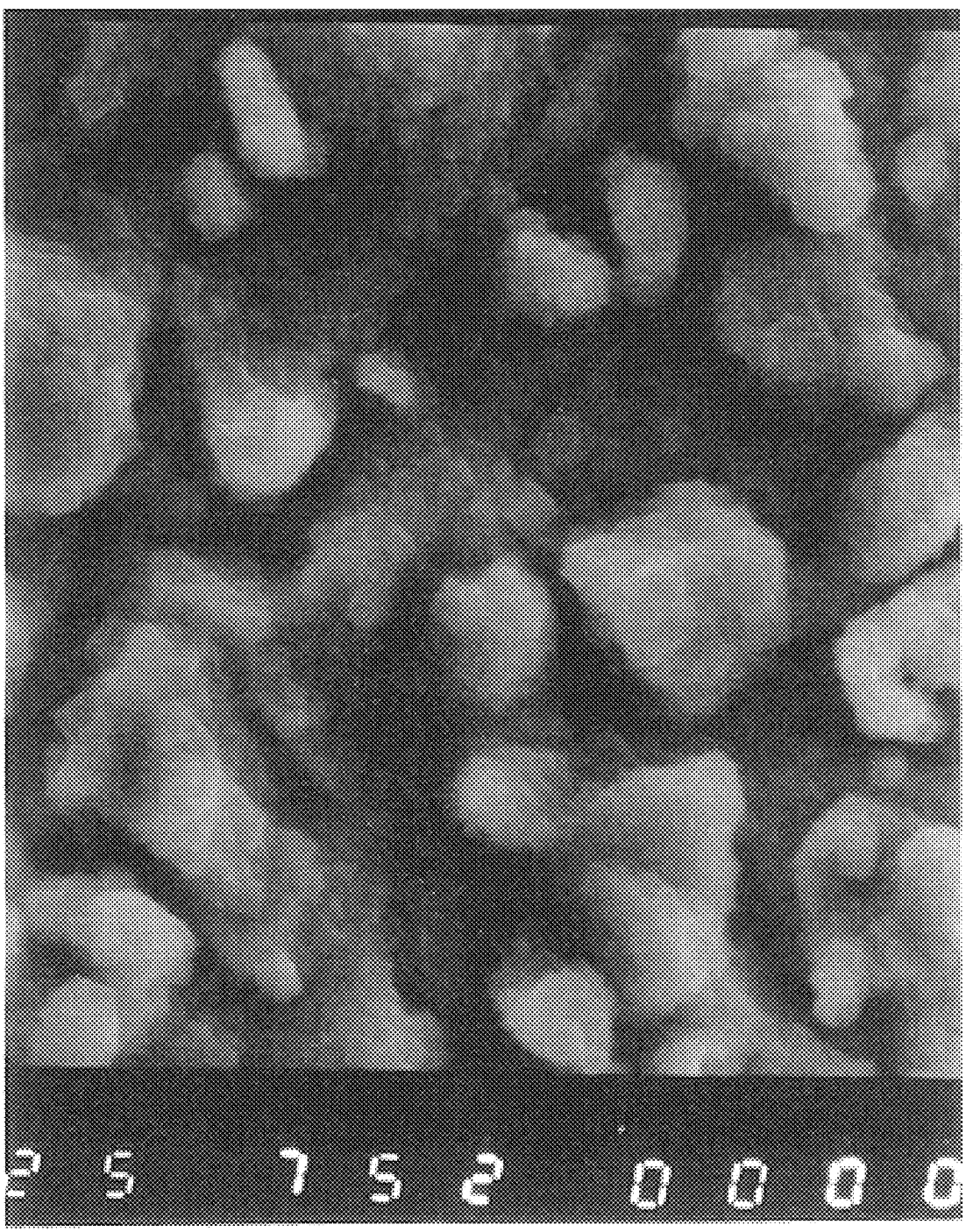

FIGS. 6A and 6B show the microscopic difference between completely annealed smooth metal particles and metal crystals with flat faces and angles used to establish sintering temperature. The selection of base metals for the process depends on the metal being electroplated and the molten salts electrolyte. The criteria for selection of a base metal in this process are that: (1) its melting point is greater than melting point of metal, (2) it does not form an alloy or compound with the metal at temperature up to 0.75 times the melting point of metal on the absolute scale or the alloy composition is below 1 atom percent at the above temperature, (3) it does not react with the molten salts electrolyte, and (4) it is a transition metal that can form an alloy with the metal at higher temperature. The final selection, however, is to be based on experiments.

The base metals should result in an even deposit of the metal and deposits should strongly adhere to the base metal. To evaluate the suitability of a base metal, the electroplating must be carried out at the process conditions. That is, at temperature of about 0.70 times the melting point of metal on the absolute temperature scale, current density of 1–14 mA/cm$^2$, and film thickness of 5–10 micrometers. After electroplating the metal at the above conditions, the electroplated base metal is washed with distilled water to dissolve the salts, and dried under vacuum at 10–20° C. for 1–3 hours. The deposits are viewed under a microscope to determine whether they are even and microscopic or sparse and twinned, and scratch tested using a needle or knife to determine whether they flake or adhere to the base metal. A suitable base metal will form adherent, even, and microscopic deposits of the metal at these process conditions.

For example, copper and nickel base metals were selected for electroplating of cadmium from the chloroaluminate molten salts electrolyte. It was observed that cadmium deposits formed on polycrystalline copper by chemical dissociation reaction in 1 weight percent solution of cadmium iodide in the chloroaluminate melt at 139.5° C. The cadmium deposits were formed on nickel by electroplating, at a current density of 1.8 mA/cm$^2$ at 139.5° C. Iron had a tendency to rust in the chloroaluminate melt, and stainless steels such as 4340, 320 and 316 stainless steels produced deposits that could flake and these deposits were sparsely populated on the base metal.

FIG. 6A shows the thin cadmium film that is formed on polycrystalline copper base metal by the chemical disproportion of cadmium ions in a solution of 1 weight percent cadmium iodide in the chloroaluminate melt at 139.5° C. and magnification of 9,000 times. FIG. 6B shows a cadmium film of 3.8 micrometers on polycrystalline nickel base metal obtained by electroplating at a current density of 17.5 milliampere per square centimeter from solution of 4.25 weight percent cadmium chloride in the chloroaluminate melt at 118.5° C. and magnification of 7,500 times. These figures show that smooth metal particles of cadmium can be produced on a suitable base metal when the metal deposition temperature is increased from 118.5° C. to 139.5° C.

For soft metals, the equivalent temperature increase is 0.035 fraction of the melting point of metal on the absolute temperature scale. The procedure involves electroplating at the initial temperature of the electrolyte, washing and drying the electroplated base metal, viewing the electroplated base metal under a microscope at a high magnification of 7,500–10,000 times. If deposits consist of flat faces and angles, temperature of the electrolyte is increased by the above amount and repeating these steps until smooth metal particles are formed on a base metal. The formation of particles confirms that this is not a case of epitaxial growth.

Figure 7A:
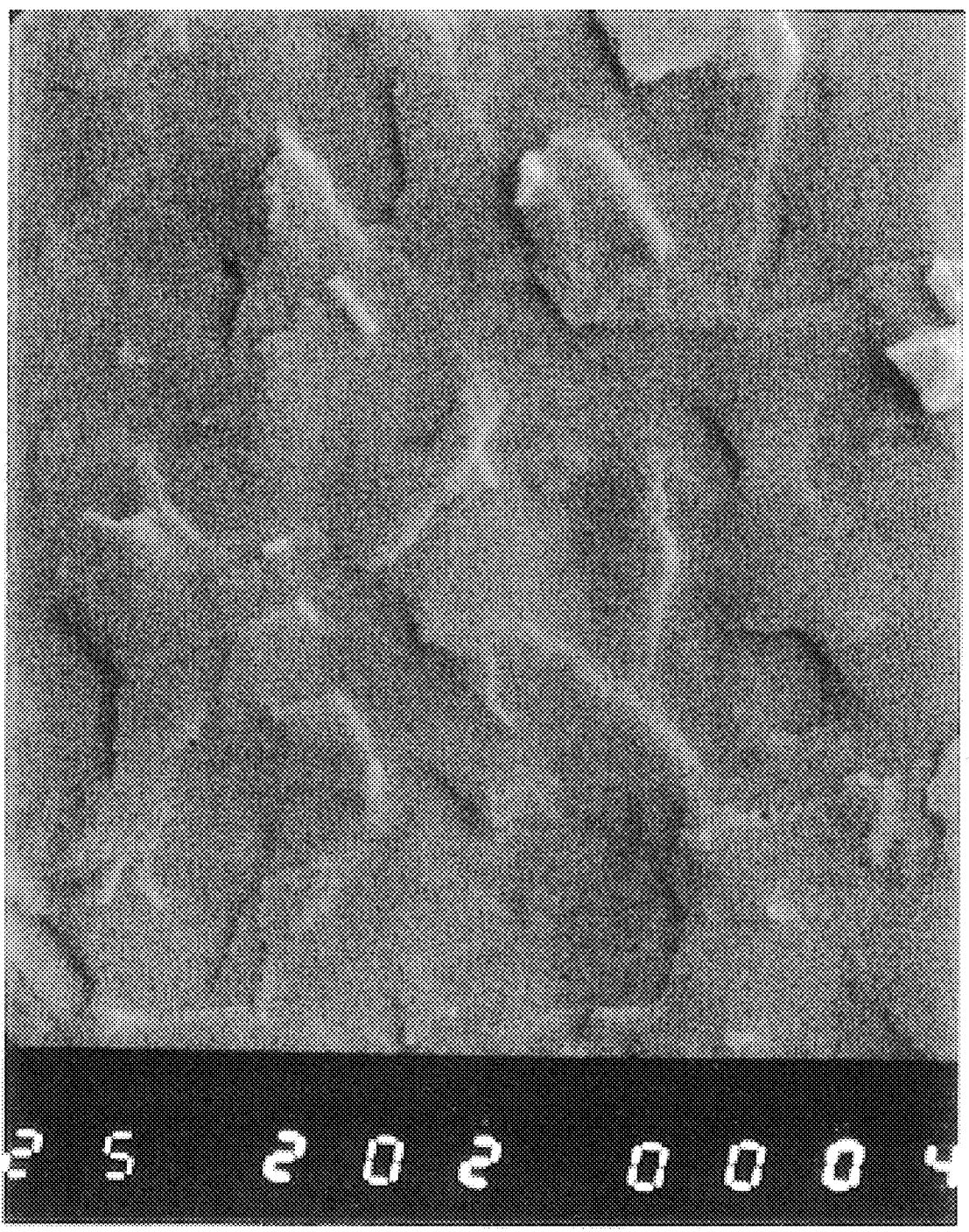
FIGS. 7A and 7B show the microscopic difference between complete and partial sintering and recrystallization in metal layers used to establish film formation temperature.
Figure 7B:
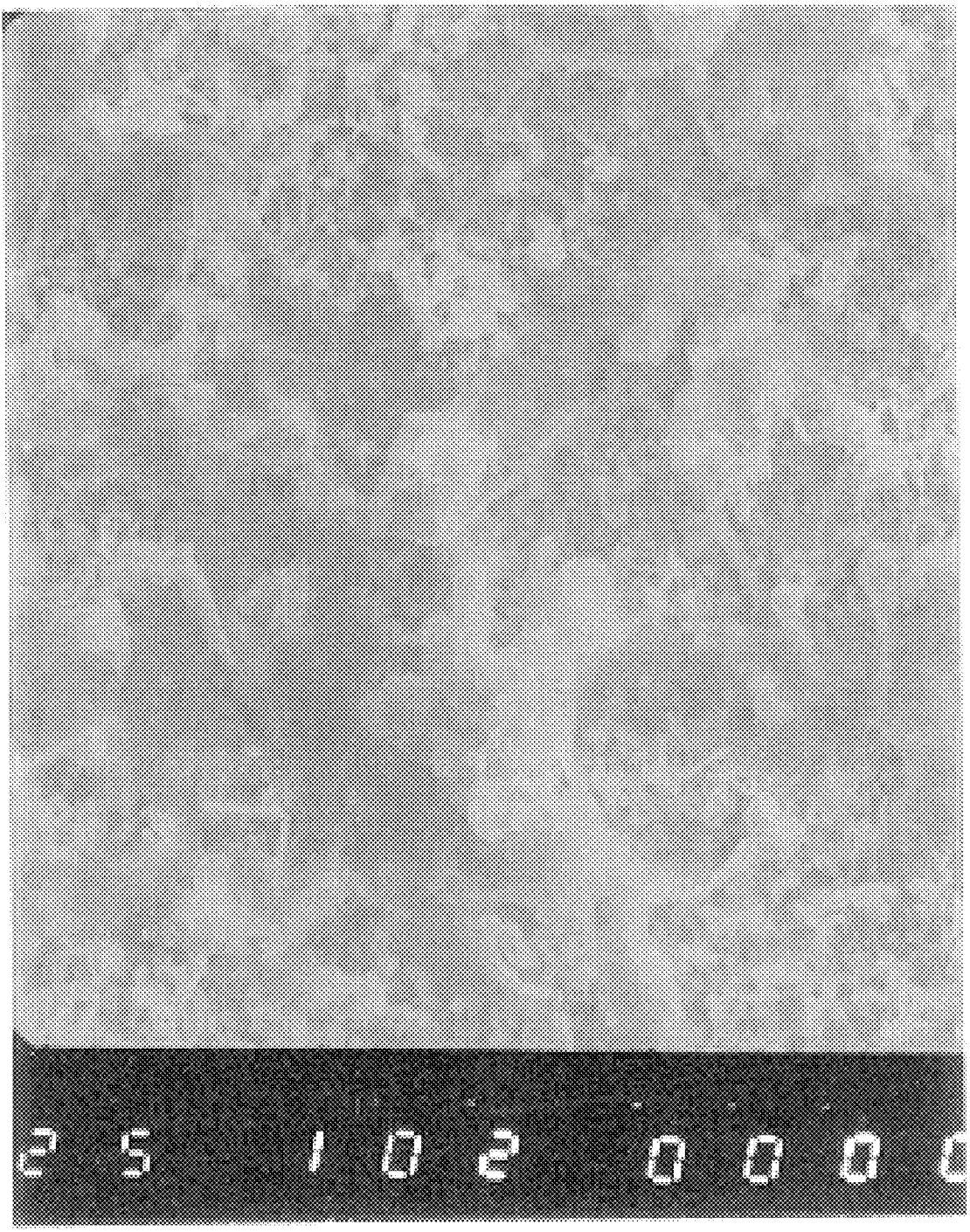

FIGS. 7A and 7B show the microscopic difference between complete and partial sintering and recrystallization in the metal layer used to establish the desired film formation temperature. The temperature at which annealed and smooth metal particles can be produced is insufficient to sinter and recrystallize metal particles completely (which involves grain growth) during the electroplating. This is demonstrated in FIGS. 7A and 7B.

FIG. 7A shows the cadmium film produced on polycrystalline nickel base metal by electroplating at a current density of 14.8 mA/cm$^2$ over a period of 0.225 hours from a solution of 2.1 weight percent of cadmium chloride in purified chloroaluminate melt at 169° C. and magnification of 2,000 times. The figure shows complete sintering and recrystallization.

The FIG. 7B shows the cadmium film produced on polycrystalline nickel base metal by electroplating at a current density of 1.8 mA/cm$^2$ over a period of 3.25 hours from a solution of 1 weight percent cadmium iodide in purified chloroaluminate melt at 139.5° C. and magnification of 1,000 times. This figure shows some recrystallized patches but the irregular features are the dominant deposit form at 139.5° C. That is, There is no guarantee that at a temperature at which smooth particles are formed that sintering, recrystallization, and grains will go to completion.

On a comparison of the conditions in these figures, it can be seen that a lower current density and higher deposition time were clearly insufficient for complete sintering and recrystallization of cadmium at 139.5° C. For complete sintering and recrystallization, a higher temperature is needed at which formation of the irregular features (or free deposits produced by incomplete sintering) is completely suppressed. Further, the higher temperature is necessary to allow the grains formed during recrystallization to grow into an annealed monolith layer.

In case of cadmium electroplating, the electroplating temperature had to be raised from 139.5° C. to 169° C. to achieve complete sintering, recrystallization, disappearance of grains during the deposition. Assuming similar metallurgical properties for other soft metals, this corresponds to increasing the temperature further by about 0.05 fraction of the melting point of the metal on the absolute temperature scale. Clearly, higher temperature will be required for hard metals as their diffusion coefficients are slower than those of soft metals at similar temperature.

The molten salts electrolyte temperature must be raised above the temperature at which smooth metal particles are formed, by about 0.05 times the melting point of metal on the absolute temperature scale. Then electroplating is carried out at current density of 2–28 mA/cm$^2$ until a completely sintered and recrystallized single crystal metal layer is produced. In case of metals having a different crystal structure at room temperature, slow cooling can be carried out after the electroplating. The metal film must be washed, dried and viewed under a microscope to confirm complete sintering. Grain sizes of diameter of 0.6 cm were readily obtained. If the electroplated metal has a different crystal structure at room temperature, it must be cooled slowly so that desired phase transformation can be achieved.

OPERATION OF INVENTION

To electroplate a single crystal metal layer from a molten salts electrolyte, one must first select an appropriate molten salts electrolyte from which a deposit of the metal can be obtained. When the selected molten salts electrolyte does not contain the metal ions, a salt of the metal needs to be dissolved in the electrolyte. To avoid corrosion and ensure that moisture does not interfere with the electrochemical reactions, the work is typically carried out under an inert atmosphere.

For example, electroplating of cadmium is typically carried out from aqueous electrolytes. Therefore, an appropriate molten salts system first needs to be selected for electroplating cadmium. Cadmium has a low melting point vis. 321° C. so molten salts that have lower melting points must be considered. The chloroaluminate molten salts that contain aluminum chloride typically form melts that have lower melting point than cadmium. It is known that cadmium can be deposited from a chloroaluminate salts electrolyte. Therefore, chloroaluminate salts are clearly suitable molten salts for the electroplating of cadmium.

One can formulate a mixture to suit the requirements of the metal. For example, two known haloaluminate molten salts electrolytes were considered in this case. Neither of these systems contain cadmium ions, hence a suitable cadmium salt was needed to be added to the melts. Typically, halide salts are better solutes for halide molten salts electrolytes. In this work, cadmium iodide and cadmium chloride salts were selected as the source for cadmium ions.

Next, the base metal was to be selected. The base metals on which a thin film of the metal can be formed and have higher melting points than the metal can be selected. In this work, several base metals such as stainless steels, copper, iron, and nickel were considered. The selection required extensive experiments after which copper and nickel were selected as base metals.

Besides the above, other electrodes of the electrochemical cell must also be decided. For example, a cadmium counter and reference electrodes were selected in this work. After these decisions, a number of cells were prepared from the selected components and several studies were carried out to decide which of these would be best suited for the electroplating work. In the end, the system consisted of a chloroaluminate electrolyte with dissolved cadmium chloride or cadmium iodide, cadmium counter and reference electrodes. In addition, an extra cadmium rod was inserted into the electrolyte in view of the cadmium chemistry in chloroaluminate melts. The working electrodes consisted of the various base metals. The temperature of the molten salts electrolyte were monitored using a chromel-alumel thermocouple with a steel sheath.

Initial experiments were used to develop the purification procedures for the electrolyte and substrate preparation procedures. Most molten salts electrolytes such as halides salts must operate under a purified dry inert gas atmosphere inside a glove box. This is because molten salts are very corrosive in presence of moisture, and dissolved oxides can complicate their electrochemistry, as well as react with base metals and the electroplated metal. In this case, the chloroaluminate melts are volatile and change of composition of these electrolytes can change their electrochemistry. Therefore a closed cell was developed for the electroplating. Again, a well-defined surface area of the working electrode is necessary to define current densities. So the working electrode areas were measured in the electrochemical experiments.

The chloroaluminate electrolyte was prepared by melting together stoichiometric quantities of anhydrous and ultra pure sublimed aluminum chloride, sodium chloride, and barium chloride in a closed thick-walled graphite crucible at 170° C. In several studies an excess of about 9 percent by weight of aluminum chloride was added to the mixture to allow for evaporation of the salt during the electrolyte purification. In other experiments, PYREX test-tube was used as a crucible. This simple arrangement was sufficient during initial experiments.

In general, a graphite crucible with a PTFE plug containing a chromel-alumel thermocouple was used during the electrolyte melting. The crucible was lowered into the thermal well and the electrolyte was allowed to melt at about 170° C. After the salts melted, the crucible was lifted from the thermal well and its PTFE cover was replaced with a PTFE cover containing three aluminum purification electrodes, the nickel working electrode, chromel-alumel thermocouple. The electrolyte was then allowed to freeze inside the cell in the glove box, and freezing point recorded. The freezing points typically were 67–83° C. To purify the electrolyte, the above cell was lowered into the thermal well and allowed to melt over 3 hours at about 170° C.

The traditional electrochemical circuits was sufficient in the work. During cyclic voltammetry of the blank electrolyte, the nickel working electrode, aluminum counter and reference electrodes were connected to the electrochemical equipment. The cyclic voltammetry was carried out over the potential window of the cell. This potential window ranged from the dissolution potential of nickel electrode (675 mV) to aluminum deposition potential (0 mV). After cyclic voltammetry of the blank melt, the nickel working electrode was disconnected and aluminum working electrode was connected to the electrochemical circuit. Electrolysis of the electrolyte was then carried out using the three aluminum electrodes. Purification was carried out over for several days at a potential of 100 mV (vs. Al). Intermittently, the electrolysis was stopped, cyclic voltammetry repeated to measure the impurities in the electrolyte. If the aluminum deposits on the counter electrodes were excessive they were replaced to avoid short circuit in the cell. Typically, the color of the electrolyte gave a rough idea of the purification. The melt color changed from reddish-brown to colorless or pale-yellow during purification. FIG. 3 shows the impurities currents at several potentials during the purification of the chloroaluminate electrolyte.

After purification, cadmium iodide or cadmium chloride was dissolved in the chloroaluminate melt. About 2.6 weight percent of ultra pure and anhydrous cadmium iodide was added to the electrolyte. It was observed that most of the cadmium iodide settled at the bottom of the test tube. In later experiments, only 0.26 weight percent of cadmium chloride was added to the electrolyte. The electrolyte also required filtering to remove residues from the purification step. The filtering was carried out through a fine nickel sieve placed inside a PYREX funnel. The sieve and funnel were preheated to about 170° C. The electrolyte was filtered into a graphite crucible containing cadmium chloride or in case of the cadmium iodide simply poured into a second PYREX test tube. The graphite crucible was closed with a PTFE cover containing the nickel working electrode and cadmium counter and reference electrodes or electrodes were simply suspended from retort clamps into the PYREX test tube. The electrolyte was then allowed to freeze and freezing point obtained from its cooling curve. The closed graphite cells were sealed with PTFE tape as a precaution against evaporation of the electrolyte.

Then electrochemical reactions of cadmium iodide or cadmium chloride were studied in the chloroaluminate melt using cyclic voltammetry. The cyclic voltammetry was carried out at several temperatures between 115–171° C. The potential window for these experiment ranged from aluminum deposition (about −250 mV vs. Cd) to nickel dissolution (about 425 mV vs. Cd). It was observed that 30–40 hours were needed to obtain steady concentration of cadmium halide in the chloroaluminate molten salts electrolyte. This is because cadmium halides not only dissolve by ionization but also by chemical reaction of the divalent cadmium ions with metallic cadmium to form the subvalent cadmium ions. The cadmium chloride content in the electrolyte was thus about eight to ten times the weight of cadmium chloride added. FIG. 4 shows the cadmium ions in the chloroaluminate after addition of cadmium chloride or cadmium iodide.

After the preparation of the electrolyte, it was typically melted at 150–170° C. and its potential was allowed to come to equilibrium over 3 hours. Cyclic voltammetry and/or electroplating were carried out at this temperature or the temperature was re-adjusted to a desired value and allowed to come to equilibrium over additional 3–4 hours. The electrolyte was typically allowed to freeze in the cell at the end of a working day, and re-melted the next working day. Samples of the melt were withdrawn for chemical analysis and working electrodes replaced as needed.

The working electrodes (base metals) were examined under the scanning electron microscope (SEM) and energy dispersion x-ray absorption (EDAX) after washing them with distilled water and drying under vacuum at 10–20° C. for 1–3 hours. The electrolyte samples were analyzed for the total cadmium content using atomic absorption spectrophotometer (AA). The cadmium chloride concentrations in this work are based on the total cadmium content in the chloroaluminate molten salts electrolyte.

First, the electroplating experiments were carried out in the PYREX open test tube with the 1 weight percent of cadmium iodide in the purified chloroaluminate melt. Next, the experiments were carried out in the pyrolytic graphite coated graphite closed crucible containing 2.1 weight percent of cadmium chloride in the purified chloroaluminate melt. After completion of these experiments, additional cadmium chloride was added to the electrolyte. The resulting cadmium chloride content was 4.25 weight percent. Experiments were repeated at this concentration.

BACKGROUND OF THE INVENTION

The process is based on several scientific discoveries made by the inventor during his doctorate research at the Argonne National Laboratory in 1987 and work he carried out between 1992 and 1995 and most recently in 1999. In his doctorate research proposal, the inventor proposed to develop a compact film of cadmium by electroplating it from a molten salts electrolyte. Although a film could be prepared, the results did not agree with literature. A thesis evaluation committee consisting of Drs. J. R. Selman, A. P. Brown, and R. Varma at the Illinois Institute of Technology asked to stop this line of work. However, the inventor proceeded on his own. Between 1989 and 1994, the inventor cleared the several doubts of the committee.

In 1995, the inventor developed a single mechanism that could explain the results and called the new electroplating concept the "Monolith Electroplating Phenomena". This scientific material is documented with the Patent Office at the Argonne National Laboratory, Argonne, Ill., May 1995. Recently, the Illinois Institute of Technology recalled the inventor to complete the Ph.D. degree after an internal review by Argonne National Laboratory recognized the new concept.

Dr. Paul A. Nelson (former Deputy Director of Chemical Technology Division, Argonne National Laboratory), Dr. Brian Frost (Senior Technical Adviser to the Argonne National Laboratory and former Director of Material Science Division), and Professor Darsh T. Wasan (Motorola Chair and former Provost, Illinois Institute of Technology) recognized the work.

CONCLUSIONS, RAMIFICATIONS, AND SCOPE OF INVENTION

Thus the reader will see the process of this invention can produce a single crystal layer or a layer with very large grain sizes of a metal on a polycrystalline base metal by electroplating of the metal from a molten salts electrolyte for enhanced corrosion resistance or other purposes. In addition, the grain size of the metal layer can be controlled in the process by controlling the sintering and recrystallization rates and rates of metal deposition. Furthermore, the invented process has additional advantages in that it permits the production of single crystal layers on base metals of different shapes and sizes it permits preparation of single crystal layers of different thickness it permits the production of single crystal layers of different metals it permits the use of any suitable base metal or inter-layer of suitable metal it permits deposition of different metals from their suitable molten salts and solutes it permits suitable adjustments or optimization of the process conditions it permits the selection of suitable components of the plating cell for the process it permits suitable materials of constructions, designs and dimensions of the cell it permits changes or modifications in procedures and operations it permits changes or modifications in the deposition techniques While my above description contains many specificities, these should not be construed as limitations on the scope of the invention; but rather as an exemplification of one preferred embodiment thereof. Many other variations are possible. For example, the process may be used to produce alloys by doping a single crystal metal layer with another metal, or it may be used to produce single crystal metal layers by other physical or chemical deposition methods, or it may be used to produce a composite layer of metals, or it may be used to improve the quality of metal films. Accordingly, the scope of the invention should be determined not by the embodiment(s) illustrated, but by the appended claims and the legal equivalents.

I claim:

1. A method for electroplating an annealed single crystal metal layer on to a polycrystalline base metal from a molten salts electrolyte comprising the steps of a. increasing the temperature of the molten salts electrolyte which contains a metal of the single crystal metal, to about 70% of the melting point of the single crystal metal on the absolute temperature scale, b. electroplating the base metal at a current density of 1 to 14 mA/cm$^2$ until a film of 1 to 4 micrometers thickness of said single crystal metal is deposited.

c. examining said base metal and metal deposits thereon under a microscope at magnifications of 7,500 to 10,000 times to determine if individual metal crystals of said metal have crystalline faces and angles or are smooth metal particles.

d. increasing the temperature of said molten salts electrolyte further by 3.5% of the melting point of said single crystal metal on the absolute temperature scale if said metal deposits have crystalline faces and repeating steps (b) through (c) until said individual metal crystals are smooth particles, and e. increasing the temperature of said molten salts electrolyte further by 5% of the melting point of said single crystal metal on the absolute temperature scale and electroplating said single crystal metal at a current density of 2 to 28 mA/cm$^2$ until deposits of said metal form a single crystal layer on said base metal, where, an annealed single crystal metal layer is formed on said polycrystalline base metal.

2. The method of claim 1 wherein temperature of said molten salts electrolyte ranges from 70% to less than 100% of the melting point of said single crystal metal on the absolute temperature scale.

3. The method of claim 1 wherein said metal is cadmium and said polycrystalline base metal is copper.

4. The method of claim 1 wherein said annealed single crystal metal layer has fewer than four grains per square centimeter of area of said polycrystalline base metal.

5. The method of claim 1 wherein said annealed single crystal metal layer has a different crystal structure at room temperature and is cooled slowly at equilibrium.

6. The method of claim 1 wherein said polycrystalline base metal is replaced by a single crystal base metal.

* * * * *

UNITED STATES PATENT AND TRADEMARK OFFICE
CERTIFICATE OF CORRECTION

PATENT NO.    : 6,200,453 B1
DATED         : March 13, 2001
INVENTOR(S)   : Rajeu R. Agasswal It is certified that error appears in the above-identified patent and that said Letters Patent is hereby corrected as shown below:

Title page, Item [54] and Column 1, line 1,
Change "Monolith elechroplating process" to -- Monolith electroplating process and plated product --.

Column 3,
Line 5, change "0.15" to -- 0.45 --.
Line 38, change, "it" to -- at --.

Column 4,
Line 36, change "populated" to -- populate --.

Column 9,
Line 41, change "2*10-12" to -- $2*10^{-12}$ --, and change "1.64*10-11" to -- $1.64*10^{-11}$ --.
Line 42, change "5.4*10-11" to -- $5.4*10^{-11}$ --.

Signed and Sealed this

Eleventth Day of December, 2001

*Attest:*

NICHOLAS P. GODICI
*Attesting Officer*     Acting Director of the United States Patent and Trademark Office